United States Patent
Lai et al.

(10) Patent No.: US 9,385,733 B2
(45) Date of Patent: Jul. 5, 2016

(54) CLOCK GENERATING APPARATUS AND FRACTIONAL FREQUENCY DIVIDER THEREOF

(71) Applicant: Faraday Technology Corp., Hsin-Chu (TW)

(72) Inventors: Chia-Liang Lai, Hsinchu County (TW); Song-Rong Han, New Taipei (TW); Jung-Yu Chang, New Taipei (TW); Wei-Ming Lin, Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/527,779

(22) Filed: Oct. 30, 2014

(65) Prior Publication Data
US 2016/0087636 A1 Mar. 24, 2016

(30) Foreign Application Priority Data

Sep. 23, 2014 (TW) .............................. 103132836 A (51) Int. Cl.
*H03L 7/197* (2006.01)
*H03K 23/68* (2006.01)

(52) U.S. Cl.
CPC .............. *H03L 7/1976* (2013.01); *H03K 23/68* (2013.01); *H03L 7/1974* (2013.01)

(58) Field of Classification Search
CPC ....... H03K 21/08; H03K 21/10; H03K 23/64; H03K 23/68; H03L 7/0802; H03L 7/197; H03L 7/1974; H03L 7/1976
See application file for complete search history.

(56) References Cited

U.S. PATENT DOCUMENTS

| 6,157,694 | A | 12/2000 | Larsson | |
|---|---|---|---|---|
| 6,310,498 | B1 * | 10/2001 | Larsson | H03L 7/0996 327/141 |
| 7,035,367 | B2 * | 4/2006 | Melava | H03K 23/667 331/16 |
| 7,054,404 | B2 * | 5/2006 | Saeki | G06F 7/68 331/25 |
| 7,061,331 | B2 * | 6/2006 | Parikh | H03L 7/18 327/156 |
| 7,560,962 | B2 * | 7/2009 | Kamath | H03K 23/48 327/115 |
| 7,741,889 | B2 * | 6/2010 | Chou | H03L 7/0995 327/156 |

OTHER PUBLICATIONS

Yu et al., "An FIR-Embedded Noise Filtering Method for DELTA-SIGMA Fractional-N PLL Clock Generators," IEEE Journal of Solid-State Circuits, Sep. 2009, pp. 2426-2436.
Jee et al., "A 0.1-fref BW 1GHz Fractional-N PLL with FIR-Embedded Phase-Interpolator-Based Noise Filtering," 2011 IEEE International Solid-State Circuits Conference, Feb. 20-24, 2011, pp. 94-96.

* cited by examiner

*Primary Examiner* — Patrick O'Neill
(74) *Attorney, Agent, or Firm* — Winston Hsu; Scott Margo (57) ABSTRACT

A clock generating apparatus and a fractional frequency divider thereof are provided. The fractional frequency divider includes a frequency divider (FD), a plurality of samplers, a selector and a control circuit. An input terminal of the FD is coupled to an output terminal of a multi-phase-frequency generating circuit. Input terminals of the samplers are coupled to an output terminal of the FD. Trigger terminals of the samplers receive the sampling clock signals. The input terminals of the selector are coupled to output terminals of the samplers. An output terminal of the selector is coupled to a feedback terminal of the multi-phase-frequency generating circuit. The control circuit provides a fraction code to a control terminal of the selector, so as to control the selector for selectively coupling the output terminal of one of the samplers to the feedback terminal of the multi-phase-frequency generating circuit.

24 Claims, 7 Drawing Sheets

CLOCK GENERATING APPARATUS AND FRACTIONAL FREQUENCY DIVIDER THEREOF

CROSS-REFERENCE TO RELATED APPLICATION

This application claims the priority benefit of Taiwan application serial no. 103132836, filed on Sep. 23, 2014. The entirety of the above-mentioned patent application is hereby incorporated by reference herein and made a part of this specification.

BACKGROUND

1. Technical Field

The invention relates to a frequency generating circuit, and particularly relates to a clock generating apparatus and a fractional frequency divider thereof.

2. Related Art

A clock generating apparatus can provide a clock signal complied with a rated frequency. The clock generating apparatus is configured with a frequency divider in internal thereof, so as to change a frequency of the clock signal output by the clock generating apparatus. In order to accurately adjust the frequency of the clock signal output by the clock generating apparatus, the frequency divider in the clock generating apparatus is required to have a fractional frequency dividing function. In a conventional design of the fractional frequency dividing function, a delta-sigma modulator of the frequency divider may cause a quantization error that cannot be ignored. The quantization error directly contributes to phase jitter of the output clock signal.

SUMMARY

The invention is directed to a clock generating apparatus and a fractional frequency divider thereof, which are capable of reducing a quantization error.

An embodiment of the invention provides a fractional frequency divider including a frequency divider, a plurality of samplers, a selector and a control circuit. An input terminal of the frequency divider is coupled to an output terminal of a multi-phase-frequency generating circuit for receiving an output clock signal. Input terminals of the samplers are coupled to an output terminal of the frequency divider for receiving a frequency-divided clock signal. Trigger terminals of the samplers are coupled to the multi-phase-frequency generating circuit for receiving a plurality of sampling clock signals, where phases of the sampling clock signals are different. A plurality of input terminals of the selector are respectively coupled to output terminals of the samplers. An output terminal of the selector is coupled to a feedback terminal of the multi-phase-frequency generating circuit. The control circuit provides a fraction code to a control terminal of the selector, so as to control the selector to selectively couple the output terminal of one of the samplers to the feedback terminal of the multi-phase-frequency generating circuit.

An embodiment of the invention provides a clock generating apparatus including a multi-phase-frequency generating circuit and a fractional frequency divider. The multi-phase-frequency generating circuit correspondingly generates an output clock signal and a plurality of sampling clock signals according to a reference signal and a feedback signal, where phases of the sampling clock signals are different. The fractional frequency divider includes a frequency divider, a plurality of samplers, a selector and a control circuit. An input terminal of the frequency divider is coupled to an output terminal of the multi-phase-frequency generating circuit for receiving the output clock signal. Input terminals of the samplers are coupled to an output terminal of the frequency divider for receiving a frequency-divided clock signal. Trigger terminals of the samplers are coupled to the multi-phase-frequency generating circuit for receiving the sampling clock signals. A plurality of input terminals of the selector are respectively coupled to output terminals of the samplers. An output terminal of the selector is coupled to a feedback terminal of the multi-phase-frequency generating circuit for supplying the feedback signal. The control circuit provides a fraction code to a control terminal of the selector, so as to control the selector to selectively couple the output terminal of one of the samplers to the feedback terminal of the multi-phase-frequency generating circuit.

According to the above descriptions, the clock generating apparatus and the fractional frequency divider are capable of using a low frequency clock signal output by the frequency divider to implement a fractional frequency dividing function. Therefore, the fractional frequency divider is capable of reducing quantization error and reducing power consumption.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

Figure 1:
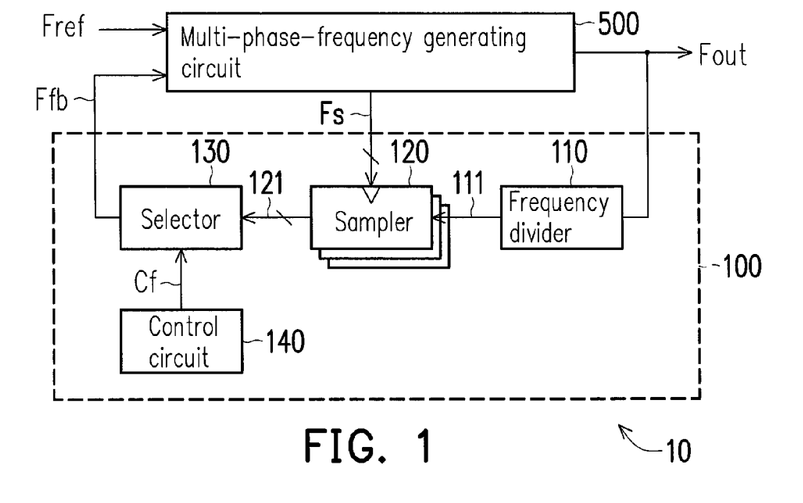
FIG. 1 is a circuit block schematic diagram of a clock generating apparatus according to an embodiment of the invention.

FIG. 1 is a circuit block schematic diagram of a clock generating apparatus 10 according to an embodiment of the invention. The clock generating apparatus 10 includes a fractional frequency divider 100 and a multi-phase-frequency generating circuit 500. The multi-phase-frequency generating circuit 500 correspondingly generates an output clock signal Fout and a plurality of sampling clock signals Fs according to a reference signal Fref and a feedback signal Ffb, where phases of the sampling clock signals Fs are different, and the number of the sampling clock signals Fs can be determined according to an actual design requirement.

The fractional frequency divider 100 includes a frequency divider 110, a plurality of samplers 120, a selector 130 and a control circuit 140. An input terminal of the frequency divider 110 is coupled to an output terminal of the multi-phase-frequency generating circuit 500 for receiving the output clock signal Fout.

Input terminals of the samplers 120 are coupled to an output terminal of the frequency divider 110 for receiving a frequency-divided clock signal 111. Trigger terminals of the samplers 120 are coupled to the multi-phase-frequency generating circuit 500 for receiving the sampling clock signals Fs. Output terminals of the samplers 120 are respectively coupled to a plurality of input terminals of the selector 130 for providing sampling results 121. For example, an input terminal of a first sampler in the plurality of samplers 120 is coupled to the output terminal of the frequency divider 110 for receiving the frequency-divided clock signal 111; a trigger terminal of the first sampler is coupled to the multi-phase-frequency generating circuit 500 for receiving a first sampling clock signal in the plurality of sampling clock signals Fs; and an output terminal of the first sampler is coupled to a first input terminal in the plurality of input terminals of the selector 130 for providing a first sampling result in the sampling results 121. An input terminal of a second sampler in the plurality of samplers 120 receives the frequency-divided clock signal 111; a trigger terminal of the second sampler receives a second sampling clock signal in the plurality of sampling clock signals Fs; and an output terminal of the second sampler is coupled to a second input terminal in the plurality of input terminals of the selector 130 for providing a second sampling result in the sampling results 121. The other samplers in the plurality of samplers 120 can be deduced according to related descriptions of the first sampler and the second sampler, which are not repeated.

Based on trigger of the sampling clock signals Fs with different phases, the samplers 120 can respectively sample the frequency-divided clock signal 111 at different time points, and respectively output the sampling result 121 to the corresponding input terminal of the selector 130. The samplers 120 of the present embodiment can be implemented by any means. For example, in some embodiments (though the invention is not limited thereto), the samplers 120 can be flip-flops. In other embodiments, the samplers 120 can be latches.

Figure 2:
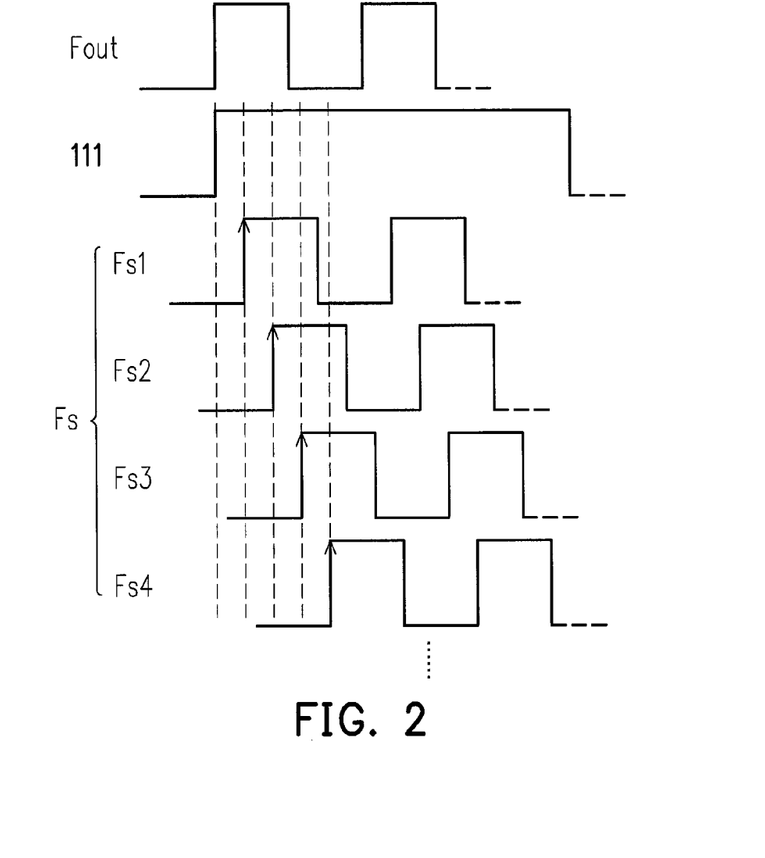
FIG. 2 and FIG. 3 are timing diagrams of signals shown in FIG. 1 according to an embodiment of the invention.
Figure 3:
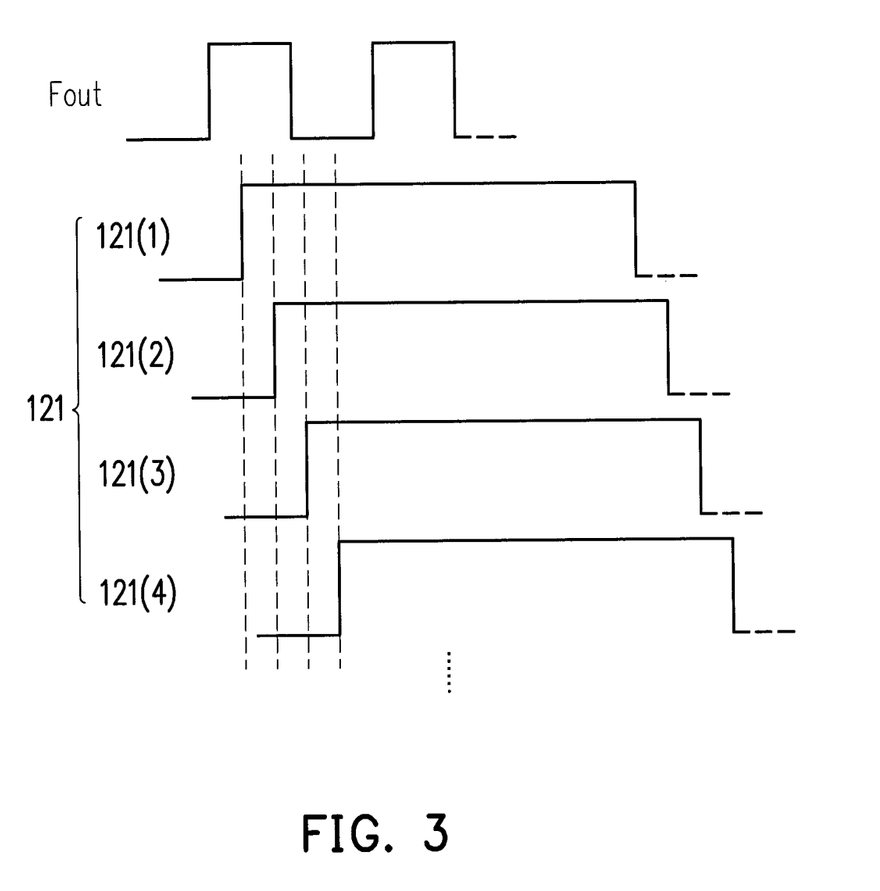

FIG. 2 and FIG. 3 are timing diagrams of signals shown in FIG. 1 according to an embodiment of the invention. Referring to FIG. 1, FIG. 2 and FIG. 3, the frequency divider 110 divides a frequency of the high frequency clock signal Fout output by the multi-phase-frequency generating circuit 500 to output the frequency-divided clock signal 111 with a low frequency. According to a trigger timing (for example, a rising edge) of a first sampling clock signal Fs1 in the plurality of sampling clock signals Fs, the first sampler in the samplers 120 samples the frequency-divided clock signal 111, and provides a first sampling result 121(1) in the sampling results 121 to the first input terminal of the selector 130. According to a trigger timing (for example, a rising edge) of a second sampling clock signal Fs2 in the plurality of sampling clock signals Fs, the second sampler in the samplers 120 samples the frequency-divided clock signal 111, and provides a second sampling result 121(2) in the sampling results 121 to the second input terminal of the selector 130. According to a trigger timing (for example, a rising edge) of a third sampling clock signal Fs3 in the plurality of sampling clock signals Fs, the third sampler in the samplers 120 samples the frequency-divided clock signal 111, and provides a third sampling result 121(3) in the sampling results 121 to the third input terminal of the selector 130. According to a trigger timing (for example, a rising edge) of a fourth sampling clock signal Fs4 in the plurality of sampling clock signals Fs, the fourth sampler in the samplers 120 samples the frequency-divided clock signal 111, and provides a fourth sampling result 121(4) in the sampling results 121 to the fourth input terminal of the selector 130.

Referring to FIG. 1, a control terminal of the selector 130 is coupled to an output terminal of the control circuit 140 for receiving a fraction code Cf. An output terminal of the selector 130 is coupled to a feedback terminal of the multi-phase-frequency generating circuit 500 for supplying the feedback signal Ffb. The control circuit 140 provides the fraction code Cf to the control terminal of the selector 130, so as to control the selector 130 to selectively couple the output terminal of one of the samplers 120 to the feedback terminal of the multi-phase-frequency generating circuit 500. The selector 130 can be any switch circuit or routing circuit. For example, in some embodiments (though the invention is not limited thereto), the selector may include a multiplexer. Input terminals of the multiplexer are respectively coupled to the output of one of the samplers 120. A control terminal of the multiplexer is coupled to the output terminal of the control circuit 140 for receiving the fraction code Cf. An output terminal of the multiplexer is coupled to the feedback terminal of the multi-phase-frequency generating circuit 500 for supplying the feedback signal Ffb.

Figure 4:
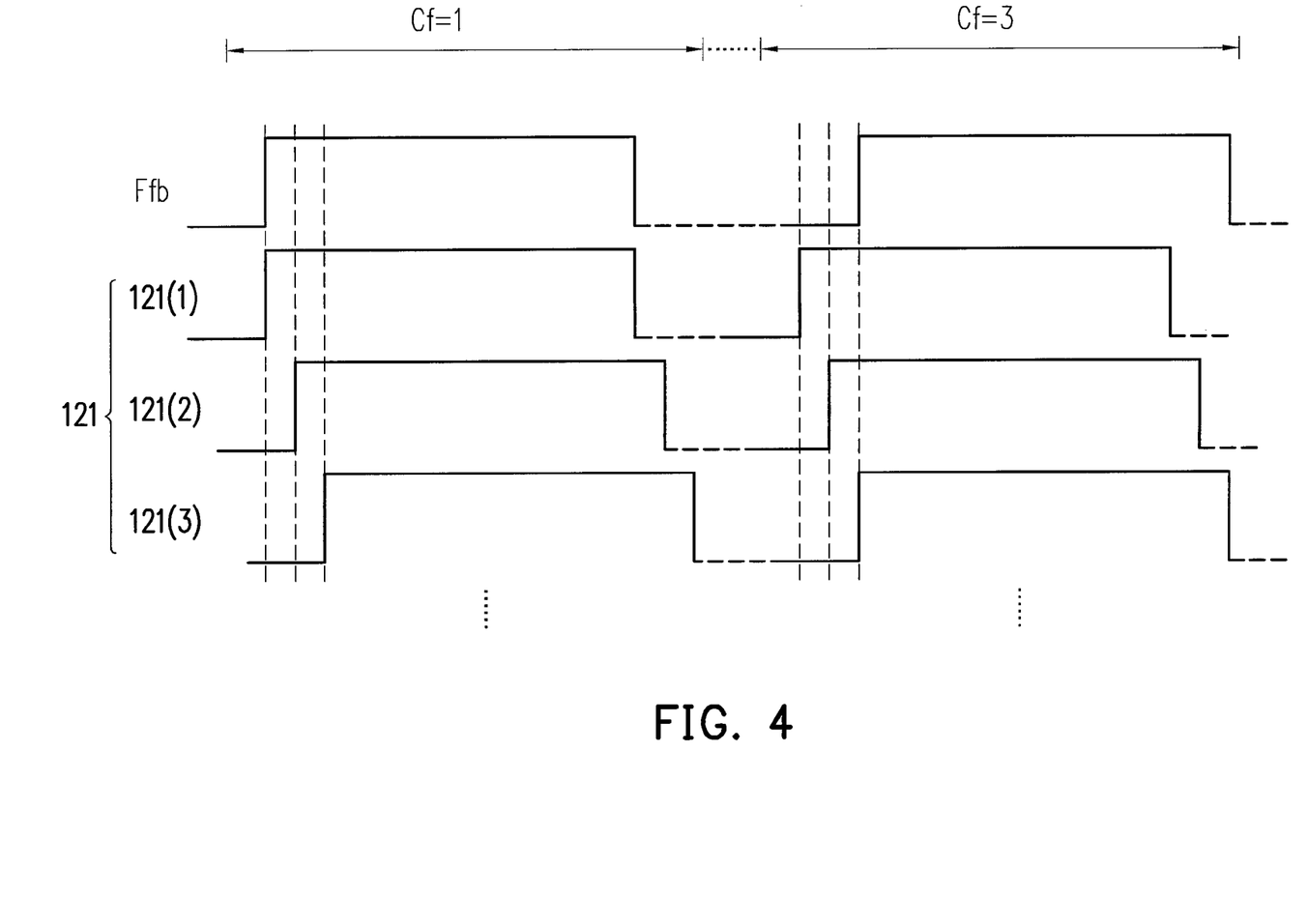
FIG. 4 is a waveform schematic diagram of the signals shown in FIG. 1 according to an embodiment of the invention.

FIG. 4 is a waveform schematic diagram of the signals shown in FIG. 1 according to an embodiment of the invention. Through the control of the fraction code Cf, the selector 130 can selectively couple the output terminal of one of the samplers 120 to the feedback terminal of the multi-phase-frequency generating circuit 500. For example, when the fraction code Cf is "1", the selector 130 selects the first sampling result 121(1) output by the first sampler in the samplers 120 to serve as the feedback signal Ffb, and transmits the same to the feedback terminal of the multi-phase-frequency generating circuit 500. When the fraction code Cf is "3", the selector 130 selects the third sampling result 121(3) output by the third sampler in the samplers 120 to serve as the feedback signal Ffb, and transmits the same to the feedback terminal of the multi-phase-frequency generating circuit 500.

Referring to FIG. 1, the control circuit 140 can change a phase of the feedback signal Ffb by changing the fraction code Cf. Therefore, the fractional frequency divider 100 can implement a multi-modulus fractional frequency divider. Besides, since the selector 130 implements the fractional frequency dividing function by using the low frequency clock signal 111 (other than the high frequency output clock signal Fout) output by the frequency divider 110, the fractional frequency divider 100 can reduce quantization error and reduce power consumption.

Figure 5:
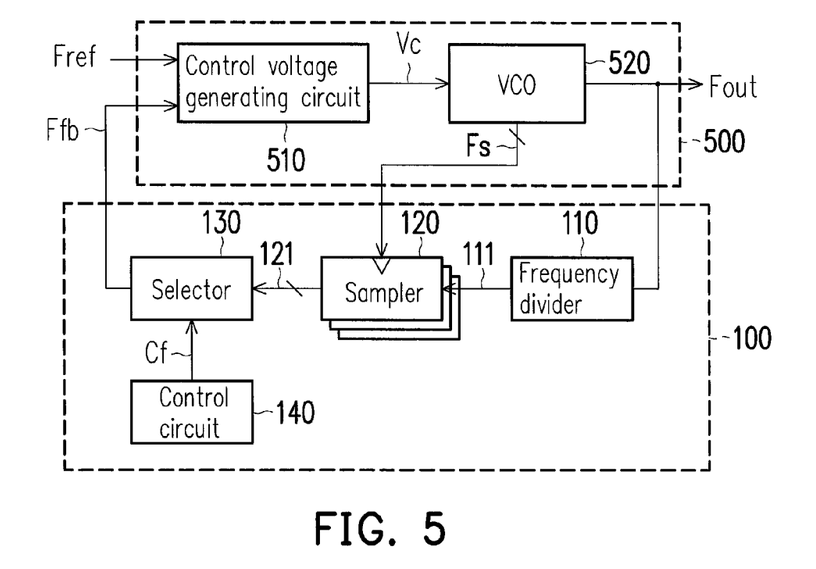
FIG. 5 is a circuit block schematic diagram of a multi-phase-frequency generating circuit of FIG. 1 according to an embodiment of the invention.

FIG. 5 is a circuit block schematic diagram of the multi-phase-frequency generating circuit 500 of FIG. 1 according to an embodiment of the invention. The fractional frequency divider 100 shown in FIG. 5 can be deduced according to related descriptions of FIG. 1 to FIG. 4, and details thereof are not repeated. In the embodiment of FIG. 5, the multi-phase-frequency generating circuit 500 includes a control voltage generating circuit 510 and a voltage controlled oscillator (VCO) 520. The control voltage generating circuit 510 correspondingly generates a control voltage Vc according to the reference signal Fref and the feedback signal Ffb. For example, the control voltage generating circuit 510 can detect/compare a frequency difference and/or phase difference between the reference signal Fref and the feedback signal Ffb. The control voltage generating circuit 510 correspondingly generates/adjusts the control voltage Vc according to the frequency difference and/or phase difference. The controlled voltage generating circuit 510 can be implemented by any means. For example, in some embodiments (though the invention is not limited thereto), a conventional frequency detecting circuit or a conventional phase detecting circuit can be used to implement the control voltage generating circuit 510.

A control terminal of the VCO 520 is coupled to an output terminal of the control voltage generating circuit 510 for receiving the control voltage Vc. Under control of the control voltage Vc, the VCO 520 correspondingly outputs the output clock signal Fout and the sampling clock signals Fs. Frequencies of the output clock signal Fout and the sampling clock signals Fs are determined in response to the control voltage Vc. The VCO 520 can be implemented by any means. For example, in some embodiments (though the invention is not limited thereto), a conventional voltage controlled oscillation circuit can be used to implement the VCO 520.

Figure 6:
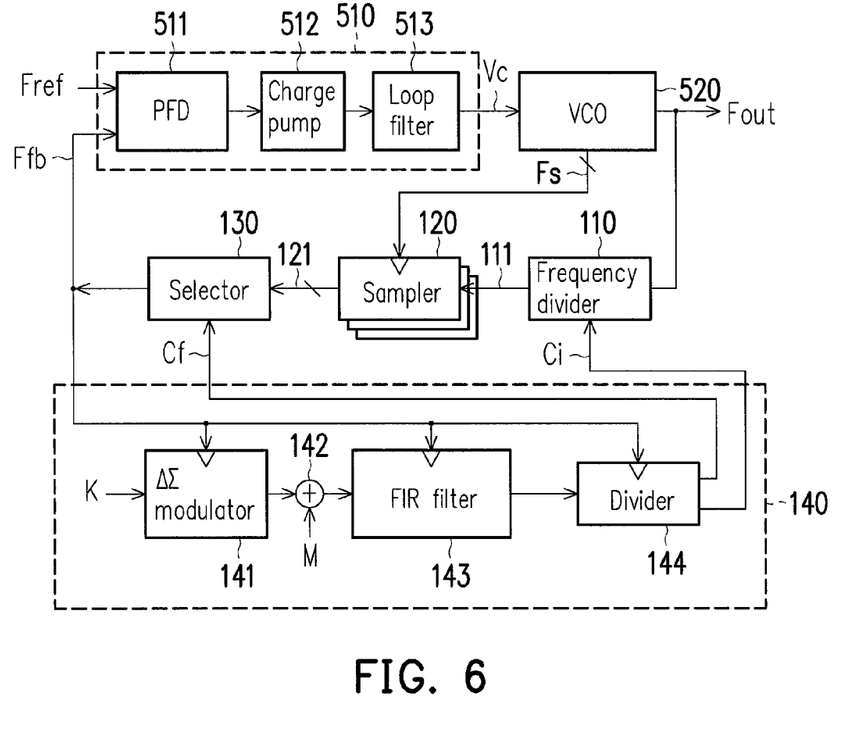
FIG. 6 is a circuit block schematic diagram of a control circuit shown in FIG. 1 and FIG. 5 and a control voltage generating circuit shown in FIG. 5 according to an embodiment of the invention.

FIG. 6 is a circuit block schematic diagram of the control circuit 140 shown in FIG. 1 and FIG. 5 and the control voltage generating circuit 510 shown in FIG. 5 according to an embodiment of the invention. The frequency divider 110, the samplers 120, the selector 130 and the VCO 520 shown in FIG. 6 can be deduced according to related descriptions of FIG. 1 to FIG. 5, and details thereof are not repeated.

In the embodiment of FIG. 6, the control voltage generating circuit 510 includes a phase frequency detector (PFD) 511, a charge pump 512 and a loop filter 513. The PFD 511 can detect the frequency difference or phase difference of the reference signal Fref and the feedback signal Ffb to generate a corresponding detection result. In some embodiments (though the invention is not limited thereto), the detection result can be two digital signals, which are respectively a pull-up signal and a pull-down signal. The PFD 511 can be implemented by any means. For example, in some embodiments (though the invention is not limited thereto), a conventional phase frequency detecting circuit can be used to implement the PFD 511.

An input terminal of the charge pump 512 is coupled to an output terminal of the PFD 511 for receiving the detection result. The charge pump 512 can convert the detection result into the control voltage. The charge pump 512 can be implemented by any means. For example, in some embodiments (though the invention is not limited thereto), a conventional charge pump circuit can be used to implement the charge pump 512.

An input terminal of the loop filter 513 is coupled to an output terminal of the charge pump 512 for receiving the control voltage. An output terminal of the loop filter 513 is coupled to the control terminal of the VCO 520 for providing the filtered control voltage Vc. The loop filter 513 filters a high frequency part of the control voltage output by the charge pump 512, and provides the filtered control voltage Vc to the control terminal of the VCO 520. The loop filter 513 can be implemented by any means. For example, in some embodiments (though the invention is not limited thereto), a conventional filter circuit or a conventional low-pass circuit can be used to implement the loop filter 513.

The VCO 520 converts the control voltage Vc into a corresponding oscillation signal (the output clock signal Fout and the sampling clock signals Fs). The frequency divider 110 can divide the frequency of the high frequency output clock signal Fout to generate the frequency-divided clock signal 111 with a low frequency. The samplers 120 and the selector 130 can fine-tune the phase of the frequency-divided clock signal 111 according to the fraction code Cf, and take the fine-tuned frequency-divided clock signal 111 as the feedback signal Ffb. The feedback signal Ffb is fed back to the PFD 511 for comparing with the reference signal Fref.

In the embodiment of FIG. 6, the control circuit 140 includes a delta-sigma modulator ($\Delta\Sigma$ modulator) 141, an adder 142, a finite impulse response (FIR) filter 143 and a divider 144. An operation clock required by the $\Delta\Sigma$ modulator 141, the FIR filter 143 and the divider 144 can be provided by the feedback signal Ffb. In other embodiments, according to an actual design requirement, the $\Delta\Sigma$ modulator 141, the FIR filter 143 and the divider 144 probably do not need the operation clock.

The $\Delta\Sigma$ modulator 141 receives a positive integer parameter K and performs delta-sigma ($\Delta\Sigma$) modulation to obtain a fractional dividing ratio. The positive integer parameter K can be set according to an actual design requirement, or dynamically determined by a control circuit of a previous stage (not shown). In other embodiments, the positive integer parameter K can be dynamically adjusted by the user. The $\Delta\Sigma$ modulator 141 can be implemented by any means. For example, in some embodiments (though the invention is not limited thereto), a conventional $\Delta\Sigma$ modulation circuit can be used to implement the $\Delta\Sigma$ modulator 141.

A first input terminal of the adder 142 is coupled to an output terminal of the $\Delta\Sigma$ modulator 141 for receiving the fractional dividing ratio. A second input terminal of the adder 142 receives an integer parameter M, where the integer parameter M can be set according to an actual design requirement or dynamically determined by the control circuit of the previous stage (not shown). In other embodiments, the integer parameter M can be dynamically adjusted by the user. The adder 142 can be implemented by any means. For example, in some embodiments (though the invention is not limited thereto), a conventional adder circuit can be used to implement the adder 142.

For example, in some embodiments (though the invention is not limited thereto), the fractional dividing ratio output by the $\Delta\Sigma$ modulator 141 can be $K/2^b$, and a frequency dividing parameter output by the adder 142 can be M+(K/$2^b$), where b is a bit number of an accumulator in internal of the ΔΣ modulator 141.

An input terminal of the FIR filter 143 is coupled to an output terminal of the adder 142 for receiving the frequency dividing parameter. An output terminal of the FIR filter 143 is coupled to an input terminal of the divider 144 for providing a filtered value. The FIR filter 143 can be implemented by any means. For example, in some embodiments (though the invention is not limited thereto), a conventional FIR filter circuit can be used to implement the FIR filter 143. In some other embodiments, the FIR filter 143 can be an N-taps FIR filter, where N is a phase number of the sampling clock signals Fs.

The input terminal of the divider 144 is coupled to the output terminal of the FIR filter 143 for receiving the filtered value. The divider 144 divides the filtered value by a divisor N to obtain a quotient, where a fractional part of the quotient is taken as the fraction code Cf and is provided to the control terminal of the selector 130, and an integer part of the quotient is taken as an integer code Ci and is provided to the frequency divider 110. The frequency divider 110 can divide the frequency of the output clock signal Fout by an integer value represented by the integer code Ci (the integer part of the quotient) to determine the frequency of the frequency-divided clock signal 111. For example, it is assumed that the integer value represented by the integer code Ci is 8, and the frequency of the output clock signal Fout is f, the frequency of the frequency-divided clock signal 111 is then f/8.

Figure 7:
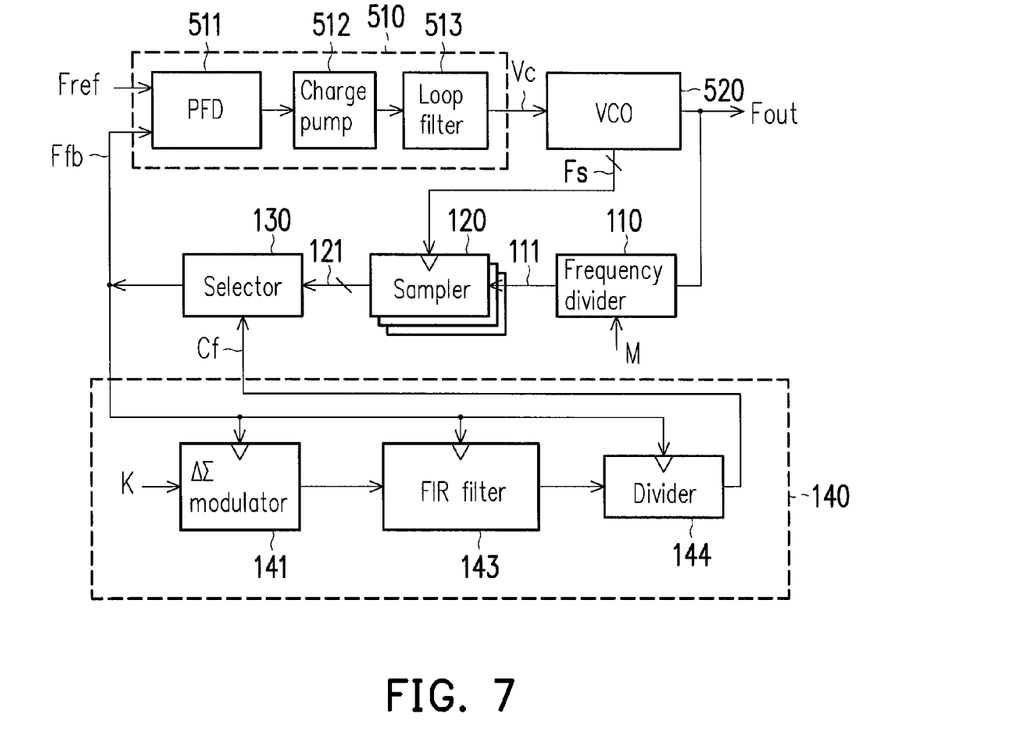
FIG. 7 is a circuit block schematic diagram of a control circuit shown in FIG. 1 and FIG. 5 according to another embodiment of the invention.

Implementation of the control circuit 140 shown in FIG. 1 and FIG. 5 is not limited to the implementation of FIG. 6. For example, FIG. 7 is a circuit block schematic diagram of the control circuit 140 shown in FIG. 1 and FIG. 5 according to another embodiment of the invention. The frequency divider 110, the samplers 120, the selector 130, the control voltage generating circuit 510 and the VCO 520 can be deduced according to related descriptions of FIG. 1 to FIG. 6, and details thereof are not repeated.

In the embodiment of FIG. 7, the control circuit 140 includes the ΔΣ modulator 141, the FIR filter 143 and the divider 144. The ΔΣ modulator 141 receives the positive integer parameter K and performs ΔΣ modulation to obtain the fractional dividing ratio. The input terminal of the FIR filter 143 is coupled to the output terminal of the ΔΣ modulation for receiving the fractional dividing ratio. The input terminal of the divider 144 is coupled to the output terminal of the FIR filter 143 to receive the filtered value. The divider 144 divides the filtered value by the divisor N to obtain the fraction code Cf, and outputs the fraction code Cf to the control terminal of the selector 130. The ΔΣ modulator 141, the FIR filter 143 and the divider 144 shown in FIG. 7 can be deduced according to related description of FIG. 6, and details thereof are not repeated.

In the embodiment of FIG. 7, the integer parameter M can be directly provided to the frequency divider 110. The frequency divider 110 divides the frequency of the output clock signal Fout by the integer value represented by the integer parameter M to determine the frequency of the frequency-divided clock signal 111. For example, it is assumed that the integer value represented by the integer parameter M is 4, and the frequency of the output clock signal Fout is f, the frequency of the frequency-divided clock signal 111 is then f/4. The samplers 120 and the selector 130 can fine-tune the phase of the frequency-divided clock signal 111 according to the fraction code Cf, and take the fine-tuned frequency-divided clock signal 111 as the feedback signal Ffb. The feedback signal Ffb is fed back to the PFD 511 for comparing with the reference signal Fref.

Figure 8:
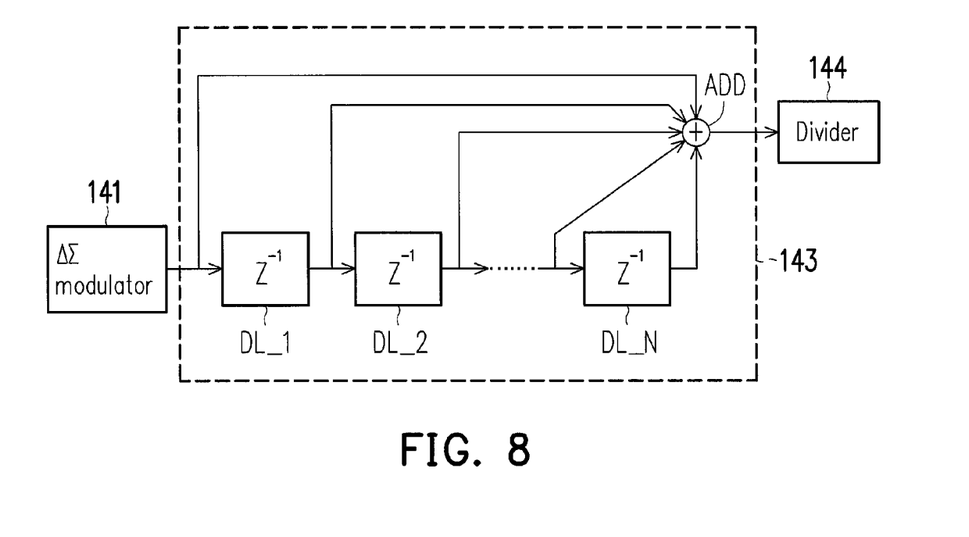
FIG. 8 is a circuit block schematic diagram of a FIR filter shown in FIG. 7 according to an embodiment of the invention.

FIG. 8 is a circuit block schematic diagram of the FIR filter 143 shown in FIG. 7 according to an embodiment of the invention. The FIR filter 143 shown in FIG. 8 includes N delay units DL_1, DL_2, . . . , DL_N and an adder ADD, where the integer N is the phase number of the sampling clock signals Fs. The phase number N of the sampling clock signals F can be determined according to an actual design requirement. The delay units DL_1-DL_N are connected in series to form a delay unit string. An input terminal of the delay unit string serves as the input terminal of the FIR filter 143. A plurality of input terminals of the adder ADD are respectively coupled to the input terminal of the FIR filter 143 and output terminals of the delay units DL_1-DL_N. An output terminal of the adder ADD serves as the output terminal of the FIR filter 143 for outputting the filtered value to the input terminal of the divider 144. The FIR filter 143 of FIG. 8 is a N-taps FIR filter.

Figure 9:
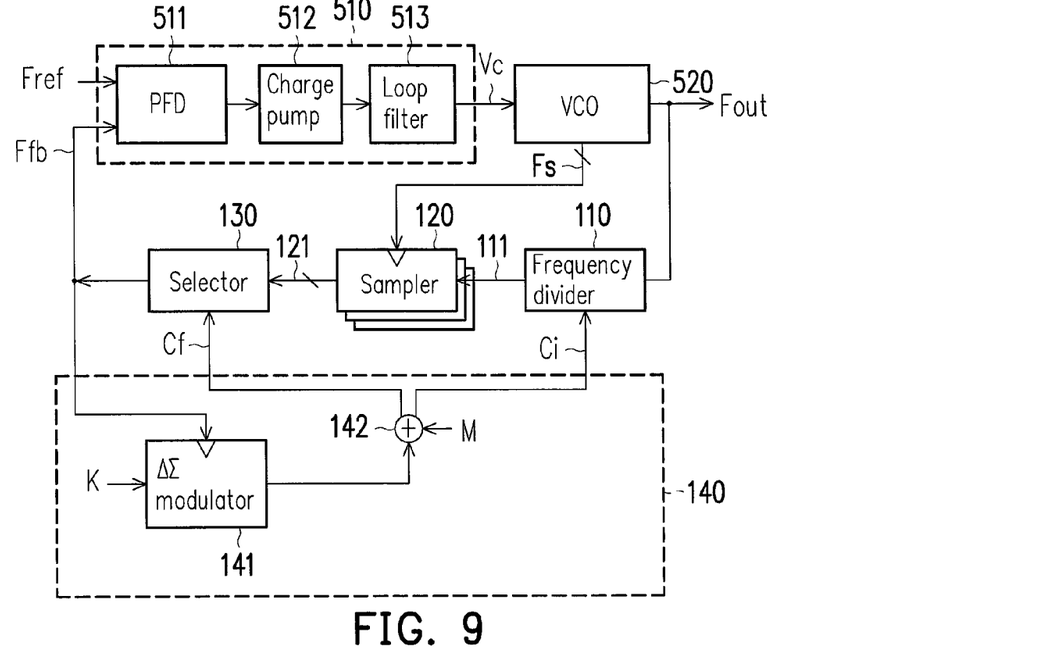
FIG. 9 is a circuit block schematic diagram of a control circuit of FIG. 1 and FIG. 5 according to still another embodiment of the invention.

FIG. 9 is a circuit block schematic diagram of the control circuit 140 of FIG. 1 and FIG. 5 according to still another embodiment of the invention. The frequency divider 110, the samplers 120, the selector 130, the control voltage generating circuit 510 and the VCO 520 of FIG. 9 can be deduced according to related descriptions of FIG. 1 to FIG. 6, and details thereof are not repeated.

In the embodiment of FIG. 9, the control circuit 140 includes the ΔΣ modulator 141 and the adder 142. The ΔΣ modulator 141 receives the positive integer parameter K and performs the ΔΣ modulation to obtain the fractional dividing ratio. A first input terminal of the adder 142 is coupled to the output terminal of the ΔΣ modulator 141 for receiving the fractional dividing ratio. A second input terminal of the adder 142 receives the integer parameter M. The ΔΣ modulator 141 and the adder 142 shown in FIG. 9 can be deduced according to related descriptions of FIG. 6, and details thereof are not repeated.

In the embodiment of FIG. 9, the output terminal of the adder 142 outputs the integer code Ci and the fraction code Cf. The fraction code Cf is provided to the control terminal of the selector 130. The integer code Ci is provided to the frequency divider 110. The frequency divider 110 divides the frequency of the output clock signal Fout by the integer value represented by the integer code Ci to determine the frequency of the frequency-divided clock signal 111. For example, it is assumed that the integer value represented by the integer code Ci is 2, and the frequency of the output clock signal Fout is f, the frequency of the frequency-divided clock signal 111 is then f/2. The samplers 120 and the selector 130 can fine-tune the phase of the frequency-divided clock signal 111 according to the fraction code Cf, and take the fine-tuned frequency-divided clock signal 111 as the feedback signal Ffb. The feedback signal Ffb is fed back to the PFD 511 for comparing with the reference signal Fref.

Figure 10:
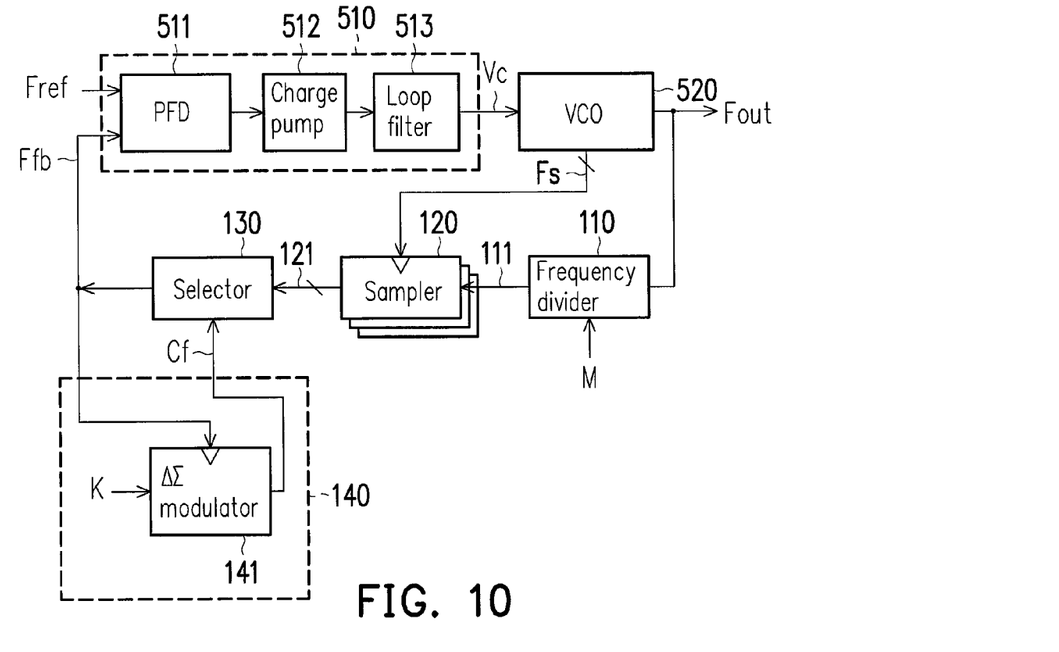
FIG. 10 is a circuit block schematic diagram of a control circuit of FIG. 1 and FIG. 5 according to still another embodiment of the invention.

FIG. 10 is a circuit block schematic diagram of the control circuit 140 of FIG. 1 and FIG. 5 according to still another embodiment of the invention. The frequency divider 110, the samplers 120, the selector 130, the control voltage generating circuit 510 and the VCO 520 of FIG. 10 can be deduced according to related descriptions of FIG. 1 to FIG. 6, and details thereof are not repeated.

In the embodiment of FIG. 10, the control circuit 140 includes the ΔΣ modulator 141. The ΔΣ modulator 141 receives the positive integer parameter K and performs the ΔΣ modulation to obtain the fractional dividing ratio. The fractional dividing ration can serve as the fraction code Cf and is provided to the control terminal of the selector 130. The ΔΣ modulator 141 of FIG. 10 can be deduced according to related description of FIG. 6, and detail thereof is not repeated.

In the embodiment of FIG. 10, the integer parameter M can be directly provided to the frequency divider 110. The frequency divider 110 divides the frequency of the output clock signal Fout by the integer value represented by the integer parameter M to determine the frequency of the frequency-divided clock signal 111. For example, it is assumed that the integer value represented by the integer parameter M is 8, and the frequency of the output clock signal Fout is f, the frequency of the frequency-divided clock signal 111 is then f/8. The samplers 120 and the selector 130 can fine-tune the phase of the frequency-divided clock signal 111 according to the fraction code Cf, and take the fine-tuned frequency-divided clock signal 111 as the feedback signal Ffb. The feedback signal Ffb is fed back to the PFD 511 for comparing with the reference signal Fref.

Figure 11:
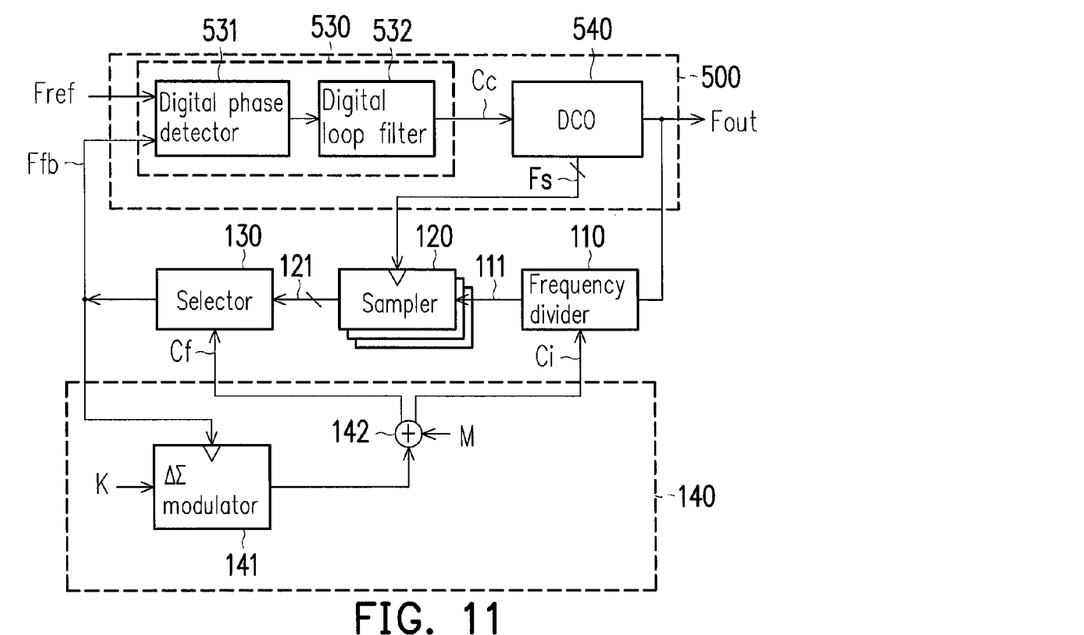
FIG. 11 is a circuit block schematic diagram of a multi-phase-frequency generating circuit shown in FIG. 1 according to another embodiment of the invention.

FIG. 11 is a circuit block schematic diagram of the multi-phase-frequency generating circuit 500 shown in FIG. 1 according to another embodiment of the invention. The frequency divider 110, the samplers 120, the selector 130 and the control circuit 140 shown in FIG. 11 can be deduced according to related descriptions of FIG. 1 to FIG. 5, and details thereof are not repeated. In the embodiment of FIG. 11, the control circuit 140 includes the ΔΣ modulator 141 and the adder 142. The ΔΣ modulator 141 and the adder 142 shown in FIG. 11 can be deduced according to related descriptions of FIG. 9, and details thereof are not repeated.

In the embodiment of FIG. 11, the multi-phase-frequency generating circuit 500 includes a control code generating circuit 530 and a digital control oscillator (DCO) 540. The control code generating circuit 530 generates a control code Cc according to the reference signal Fref and the feedback signal Ffb. For example, the control code generating circuit 530 can detect/compare a frequency difference and/or phase difference between the reference signal Fref and the feedback signal Ffb. The control code generating circuit 530 generates/adjusts the control code Cc according to the frequency difference and/or phase difference. The control code generating circuit 530 can be implemented by any means. For example, in some embodiments (though the invention is not limited thereto), a conventional frequency detection digital circuit or a conventional phase detection digital circuit can be used to implement the control code generating circuit 530.

The control terminal of the DCO 540 is coupled to an output terminal of the control code generating circuit 530 for receiving the control code Cc. Under control of the control code Cc, the DCO 540 can correspondingly generate the output clock signal Fout and the sampling clock signals Fs. The frequencies of the output clock signal Fout and the sampling clock signals Fs are determined in response to the control code Cc. The DCO 540 can be implemented by any means. For example, in some embodiments (though the invention is not limited thereto), a conventional digital oscillation circuit can be used to implement the DCO 540.

In the embodiment of FIG. 11, the control code generating circuit 530 includes a digital phase detector 531 and a digital loop filter 532. The digital phase detector 531 detects the phase difference between the reference signal Fref and the feedback signal Ffb to generate a detection result. The digital phase detector 531 can be implemented by any means. In some embodiments (though the invention is not limited thereto), a conventional phase detection digital circuit can be used to implement the digital phase detector 531. For example, the digital phase detector 531 can be a bang-bang phase detector (BBPD) or other binary phase detector.

An input terminal of the digital loop filter 532 is coupled to an output terminal of the digital phase detector 531 for receiving the detection result. An output terminal of the digital loop filter 532 is coupled to the control terminal of the DCO 540 for providing the filtered control code Cc. The digital loop filter 532 filters a high frequency part of the detection result output by the digital phase detector 531, and provides the filtered control code Cc to the control terminal of the DCO 540. The digital loop filter 532 can be implemented by any means. For example, in some embodiments (though the invention is not limited thereto), a conventional digital filter circuit can be used to implement the digital loop filter 532.

The DCO 540 converts the control code Cc to a corresponding oscillation signal (the output clock signal Fout and the sampling clock signals Fs). The frequency divider 110 can divide the frequency of the high frequency output clock signal Fout to generate the frequency-divided clock signal 111 with a low frequency. The frequency divider 110 divides the frequency of the output clock signal Fout by the integer value represented by the integer code Ci to determine the frequency of the frequency-divided clock signal 111. For example, it is assumed that the integer value represented by the integer code Ci is 16, and the frequency of the output clock signal Fout is f, the frequency of the frequency-divided clock signal 111 is then f/16. The samplers 120 and the selector 130 can fine-tune the phase of the frequency-divided clock signal 111 according to the fraction code Cf, and take the fine-tuned frequency-divided clock signal 111 as the feedback signal Ffb. The feedback signal Ffb is fed back to the PFD 511 for comparing with the reference signal Fref.

Figure 12:
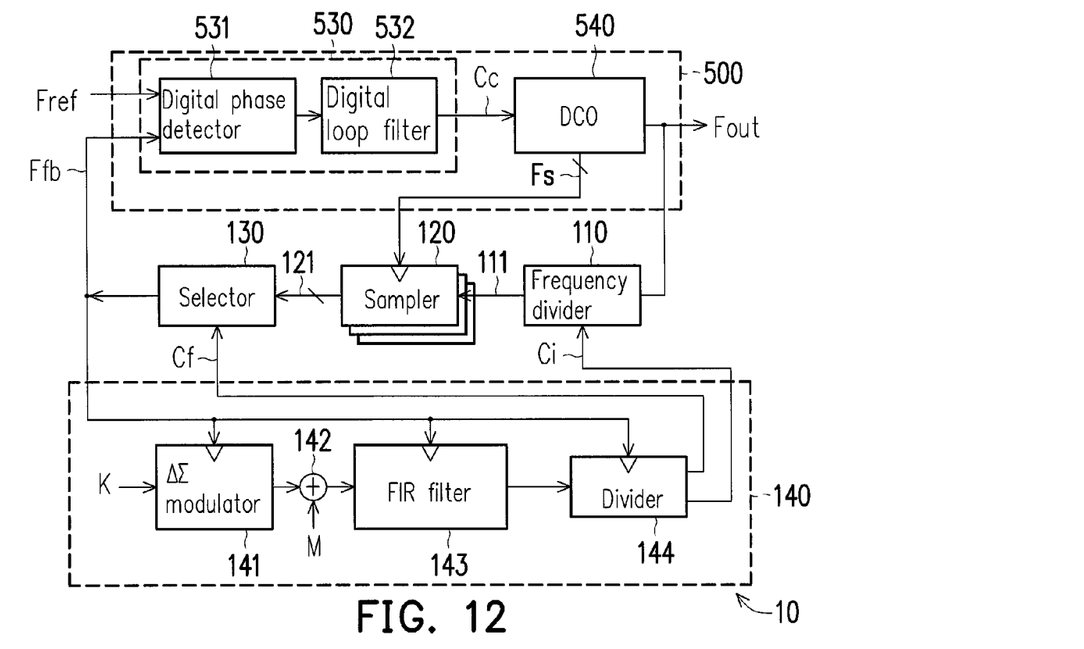
FIG. 12 is a circuit block schematic diagram of a clock generating apparatus according to another embodiment of the invention.

FIG. 12 is a circuit block schematic diagram of the clock generating apparatus 10 according to another embodiment of the invention. The frequency divider 110, the samplers 120, the selector 130 and the control circuit 140 of FIG. 12 can be deduced according to related descriptions of FIG. 1 to FIG. 6, and details thereof are not repeated. In the embodiment of FIG. 12, the control circuit 140 includes the ΔΣ modulator 141, the adder 142, the FIR filter 143 and the divider 144. The ΔΣ modulator 141, the adder 142, the FIR filter 143 and the divider 144 of FIG. 12 can be deduced according to related descriptions of FIG. 6, and details thereof are not repeated. In the embodiment of FIG. 12, the multi-phase-frequency generating circuit 500 includes the digital phase detector 531 and a digital loop filter 532 and the DCO 540. The digital phase detector 531 and a digital loop filter 532 and the DCO 540 of FIG. 12 can be deduced according to related descriptions of FIG. 11, and details thereof are not repeated.

In summary, the frequency divider 110 of the invention can divide the frequency of the high frequency output clock signal Fout to generate the frequency-divided clock signal 111 with a low frequency. The samplers 120 and the selector 130 can fine-tune the phase of the frequency-divided clock signal 111 according to the fraction code Cf, and take the fine-tuned frequency-divided clock signal 111 as the feedback signal Ffb. Namely, the control circuit 140 can change the phase of the feedback signal Ffb by changing the fraction code Cf. Therefore, the fractional frequency divider 100 can implement a multi-modulus fractional frequency divider. Besides, since the selector 130 implements the fractional frequency dividing function by using the low frequency clock signal 111 (other than the high frequency output clock signal Fout) output by the frequency divider 110, the fractional frequency divider 100 can reduce quantization error and reduce power consumption.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fractional frequency divider, comprising:
   a frequency divider, having an input terminal coupled to an output terminal of a multi-phase-frequency generating circuit for receiving an output clock signal;
   a plurality of samplers, having input terminals coupled to an output terminal of the frequency divider for receiving a frequency-divided clock signal, and trigger terminals of the samplers coupled to the multi-phase-frequency generating circuit for receiving a plurality of sampling clock signals, wherein the sampling clock signals have a same frequency and different phases;
   a selector, having a plurality of input terminals respectively coupled to output terminals of the samplers, and an output terminal coupled to a feedback terminal of the multi-phase-frequency generating circuit; and
   a control circuit, providing a fraction code to a control terminal of the selector, so as to control the selector to selectively couple the output terminal of one of the samplers to the feedback terminal of the multi-phase-frequency generating circuit.

2. The fractional frequency divider as claimed in claim 1, wherein the frequency divider divides a frequency of the output clock signal by an integer value represented by an integer code to determine a frequency of the frequency-divided clock signal.

3. The fractional frequency divider as claimed in claim 1, wherein the samplers are flip-flops or latches.

4. The fractional frequency divider as claimed in claim 1, wherein the selector comprises a multiplexer.

5. The fractional frequency divider as claimed in claim 1, wherein the control circuit comprises:
   a delta-sigma modulator, receiving a positive integer parameter and performing a delta-sigma modulation to obtain a fractional dividing ratio;
   an adder, having a first input terminal coupled to an output terminal of the delta-sigma modulator for receiving the fractional dividing ratio, and a second input terminal receiving an integer parameter;
   a finite impulse response filter, having an input terminal coupled to an output terminal of the adder for receiving a frequency dividing parameter; and
   a divider, having an input terminal coupled to an output terminal of the finite impulse response filter for receiving a filtered value, wherein the divider divides the filtered value by a divisor N to obtain a quotient, wherein N is an integer,
   wherein a fractional part of the quotient is provided to the control terminal of the selector to serve as the fraction code, and
   an integer part of the quotient is provided to the frequency divider, and the frequency divider divides a frequency of the output clock signal by an integer value represented by the integer part to determine a frequency of the frequency-divided clock signal.

6. The fractional frequency divider as claimed in claim 5, wherein it is assumed that the positive integer parameter is K, the integer parameter is M, the fractional dividing ratio is $K/2^b$, and the frequency dividing parameter is $M+(K/2^b)$, wherein b is a bit number of an accumulator in internal of the delta-sigma modulator.

7. The fractional frequency divider as claimed in claim 1, wherein the control circuit comprises:
   a delta-sigma modulator, receiving a positive integer parameter and performing a delta-sigma modulation to obtain a fractional dividing ratio;
   a finite impulse response filter, having an input terminal coupled to an output terminal of the delta-sigma modulator for receiving the fractional dividing ratio; and
   a divider, having an input terminal coupled to an output terminal of the finite impulse response filter for receiving a filtered value, wherein the divider divides the filtered value by a divisor N to obtain the fraction code, and outputs the fraction code to the control terminal of the selector, wherein N is an integer.

8. The fractional frequency divider as claimed in claim 7, wherein the finite impulse response filter comprises:
   N delay units, connected in series to form a delay unit string, wherein an input terminal of the delay unit string serves as the input terminal of the finite impulse response filter, and N is an integer; and
   an adder, having a plurality of input terminals respectively coupled to output terminals of the delay units, and an output terminal serving as the output terminal of the finite impulse response filter to output the filtered value.

9. The fractional frequency divider as claimed in claim 1, wherein the control circuit comprises:
   a delta-sigma modulator, receiving a positive integer parameter and performing a delta-sigma modulation to obtain a fractional dividing ratio; and
   an adder, having a first input terminal coupled to an output terminal of the delta-sigma modulator for receiving the fractional dividing ratio, a second input terminal receiving an integer parameter, and an output terminal outputting an integer code and the fraction code,
   wherein the fraction code is provided to the control terminal of the selector, and
   wherein the integer code is provided to the frequency divider, and the frequency divider divides a frequency of the output clock signal by an integer value represented by the integer code to determine a frequency of the frequency-divided clock signal.

10. The fractional frequency divider as claimed in claim 1, wherein the control circuit comprises:
    a delta-sigma modulator, receiving a positive integer parameter and performing a delta-sigma modulation to obtain a fractional dividing ratio,
    wherein the fractional dividing ratio is provided to the control terminal of the selector to serve as the fraction code.

11. A clock generating apparatus, comprising:
    a multi-phase-frequency generating circuit, correspondingly generating an output clock signal and a plurality of sampling clock signals according to a reference signal and a feedback signal, wherein the sampling clock signals have a same frequency and different phases; and
    a fractional frequency divider, comprising;
       a frequency divider, having an input terminal coupled to an output terminal of the multi-phase-frequency generating circuit for receiving the output clock signal;
       a plurality of samplers, having input terminals coupled to an output terminal of the frequency divider for receiving a frequency-divided clock signal, and trigger terminals coupled to the multi-phase-frequency generating circuit for receiving the sampling clock signals;
       a selector, having a plurality of input terminals respectively coupled to output terminals of the samplers, and an output terminal coupled to a feedback terminal of the multi-phase-frequency generating circuit for supplying the feedback signal; and a control circuit, providing a fraction code to a control terminal of the selector, so as to control the selector to selectively couple the output terminal of one of the samplers to the feedback terminal of the multi-phase-frequency generating circuit.

12. The clock generating apparatus as claimed in claim 11, wherein the frequency divider divides a frequency of the output clock signal by an integer value represented by an integer code to determine a frequency of the frequency-divided clock signal.

13. The clock generating apparatus as claimed in claim 11, wherein the samplers are flip-flops or latches.

14. The clock generating apparatus as claimed in claim 11, wherein the selector comprises a multiplexer.

15. The clock generating apparatus as claimed in claim 11, wherein the control circuit comprises:
a delta-sigma modulator, receiving a positive integer parameter and performing a delta-sigma modulation to obtain a fractional dividing ratio;
an adder, having a first input terminal coupled to an output terminal of the delta-sigma modulator for receiving the fractional dividing ratio, and a second input terminal receiving an integer parameter;
a finite impulse response filter, having an input terminal coupled to an output terminal of the adder for receiving a frequency dividing parameter; and
a divider, having an input terminal coupled to an output terminal of the finite impulse response filter for receiving a filtered value, wherein the divider divides the filtered value by a divisor N to obtain a quotient, wherein N is an integer,
wherein a fractional part of the quotient is provided to the control terminal of the selector to serve as the fraction code, and
an integer part of the quotient is provided to the frequency divider, and the frequency divider divides a frequency of the output clock signal by an integer value represented by the integer part to determine a frequency of the frequency-divided clock signal.

16. The clock generating apparatus as claimed in claim 15, wherein it is assumed that the positive integer parameter is K, the integer parameter is M, the fractional dividing ratio is $K/2^b$, and the frequency dividing parameter is $M+(K/2^b)$, wherein b is a bit number of an accumulator in internal of the delta-sigma modulator.

17. The clock generating apparatus as claimed in claim 11, wherein the control circuit comprises:
a delta-sigma modulator, receiving a positive integer parameter and performing a delta-sigma modulation to obtain a fractional dividing ratio;
a finite impulse response filter, having an input terminal coupled to an output terminal of the delta-sigma modulator for receiving the fractional dividing ratio; and
a divider, having an input terminal coupled to an output terminal of the finite impulse response filter for receiving a filtered value, wherein the divider divides the filtered value by a divisor N to obtain the fraction code, and outputs the fraction code to the control terminal of the selector, wherein N is an integer.

18. The clock generating apparatus as claimed in claim 17, wherein the finite impulse response filter comprises:
N delay units, connected in series to form a delay unit string, wherein an input terminal of the delay unit string serves as the input terminal of the finite impulse response filter, and N is an integer; and
an adder, having a plurality of input terminals respectively coupled to output terminals of the delay units, and an output terminal serving as the output terminal of the finite impulse response filter to output the filtered value.

19. The clock generating apparatus as claimed in claim 11, wherein the control circuit comprises:
a delta-sigma modulator, receiving a positive integer parameter and performing a delta-sigma modulation to obtain a fractional dividing ratio; and
an adder, having a first input terminal coupled to an output term al of the delta-sigma modulator for receiving the fractional dividing ratio, a second input terminal receiving an integer parameter, and an output terminal outputting an integer code and the fraction code,
wherein the fraction code is provided to the control terminal of the selector, and
wherein the integer code is provided to the frequency divider, and the frequency divider divides a frequency of the output clock signal by an integer value represented by the integer code to determine a frequency of the frequency-divided clock signal.

20. The clock generating apparatus as claimed in claim 11, wherein the control circuit comprises:
a delta-sigma modulator, receiving a positive integer parameter and performing a delta-sigma modulation to obtain a fractional dividing ratio,
wherein the fractional dividing ratio is provided to the control terminal of the selector to serve as the fraction code.

21. The clock generating apparatus as claimed in claim 11, wherein the multi-phase-frequency generating circuit comprises:
a control voltage generating circuit, generating a control voltage according to the reference signal and the feedback signal; and
a voltage controlled oscillator, having a control terminal coupled to an output terminal of the control voltage generating circuit for receiving the control voltage, and generating the output clock signal and the sampling clock signals, wherein frequencies of the output clock signal and the sampling clock signals are determined in response to the control voltage.

22. The clock generating apparatus as claimed in claim 21, wherein the control voltage generating circuit comprises:
a phase frequency detector, detecting a frequency difference or a phase difference between the reference signal and the feedback signal to generate a detection result;
a charge pump, having an input terminal coupled to an output terminal of the phase frequency detector for receiving the detection result; and
a loop filter, having an input terminal coupled to an output terminal of the charge pump, and an output terminal coupled to the control terminal of the voltage controlled oscillator for providing the control voltage.

23. The clock generating apparatus as claimed in claim 11, wherein the multi-phase-frequency generating circuit comprises:
a control code generating circuit, generating a control code according to the reference signal and the feedback signal; and
a digital control oscillator, having a control terminal coupled to an output terminal of the control code generating circuit for receiving the control code, and generating the output clock signal and the sampling clock signals, wherein frequencies of the output clock signal and the sampling clock signals are determined in response to the control code.

24. The clock generating apparatus as claimed in claim 23, wherein the control code generating circuit comprises:
- a digital phase detector, detecting a phase difference between the reference signal and the feedback signal to generate a detection result; and
- a digital loop filter, having an input terminal coupled to an output terminal of the digital phase detector for receiving the detection result, and an output terminal coupled to the control terminal of the digital controlled oscillator to provide the control code.

\* \* \* \* \*